US009728428B2

(12) United States Patent
Brown

(10) Patent No.: US 9,728,428 B2
(45) Date of Patent: Aug. 8, 2017

(54) SINGLE USE RINSE IN A LINEAR MARANGONI DRIER

(71) Applicant: Applied Materials, Inc., Santa Clara, CA (US)

(72) Inventor: Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 439 days.

(21) Appl. No.: 13/932,698

(22) Filed: Jul. 1, 2013

(65) Prior Publication Data

US 2015/0000711 A1 Jan. 1, 2015

(51) Int. Cl.
*H01L 21/67* (2006.01)
(52) U.S. Cl.
CPC .. *H01L 21/67051* (2013.01); *H01L 21/67034* (2013.01); *H01L 21/67057* (2013.01)
(58) Field of Classification Search
CPC ......... H01L 21/67034; H01L 21/67057; H01L 21/67051
See application file for complete search history.

(56) References Cited

U.S. PATENT DOCUMENTS

| 6,746,544 B2 | 6/2004 | Fishkin et al. |
| 2003/0136429 A1* | 7/2003 | Scranton ............... B08B 3/08 134/30 |
| 2005/0229426 A1 | 10/2005 | Achkire et al. |
| 2008/0076263 A1 | 3/2008 | Daycock et al. |
| 2008/0271749 A1* | 11/2008 | Freer ................. H01L 21/02052 134/1.3 |
| 2009/0029560 A1* | 1/2009 | Hansen ..................... B08B 3/02 438/745 |
| 2009/0044843 A1 | 2/2009 | Shirazi |
| 2009/0202951 A1 | 8/2009 | Yamamoto et al. |
| 2010/0236579 A1 | 9/2010 | Araki et al. |

FOREIGN PATENT DOCUMENTS

KR 10-2008-0088705 10/2008

OTHER PUBLICATIONS

International Search Report and Written Opinion for International Application No. PCT/US14/40436 dated Sep. 23, 2014.

* cited by examiner

*Primary Examiner* — Jason Ko
*Assistant Examiner* — Spencer Bell
(74) *Attorney, Agent, or Firm* — Patterson + Sheridan, LLP

(57) ABSTRACT

An apparatus for drying of wet substrates in a post CMP cleaning apparatus is provided. The apparatus provides a waterfall or shallow reservoir of rinsing solution, such as DIW, through which a substrate may be lifted. A solvent vapor may be provided at the rinsing solution interface on the substrate, such as in a Marangoni process. In certain embodiments, the volume of solution through which the substrate is lifted is reduced, which may provide for reduced or eliminated particle reattachment to the substrate.

11 Claims, 1 Drawing Sheet

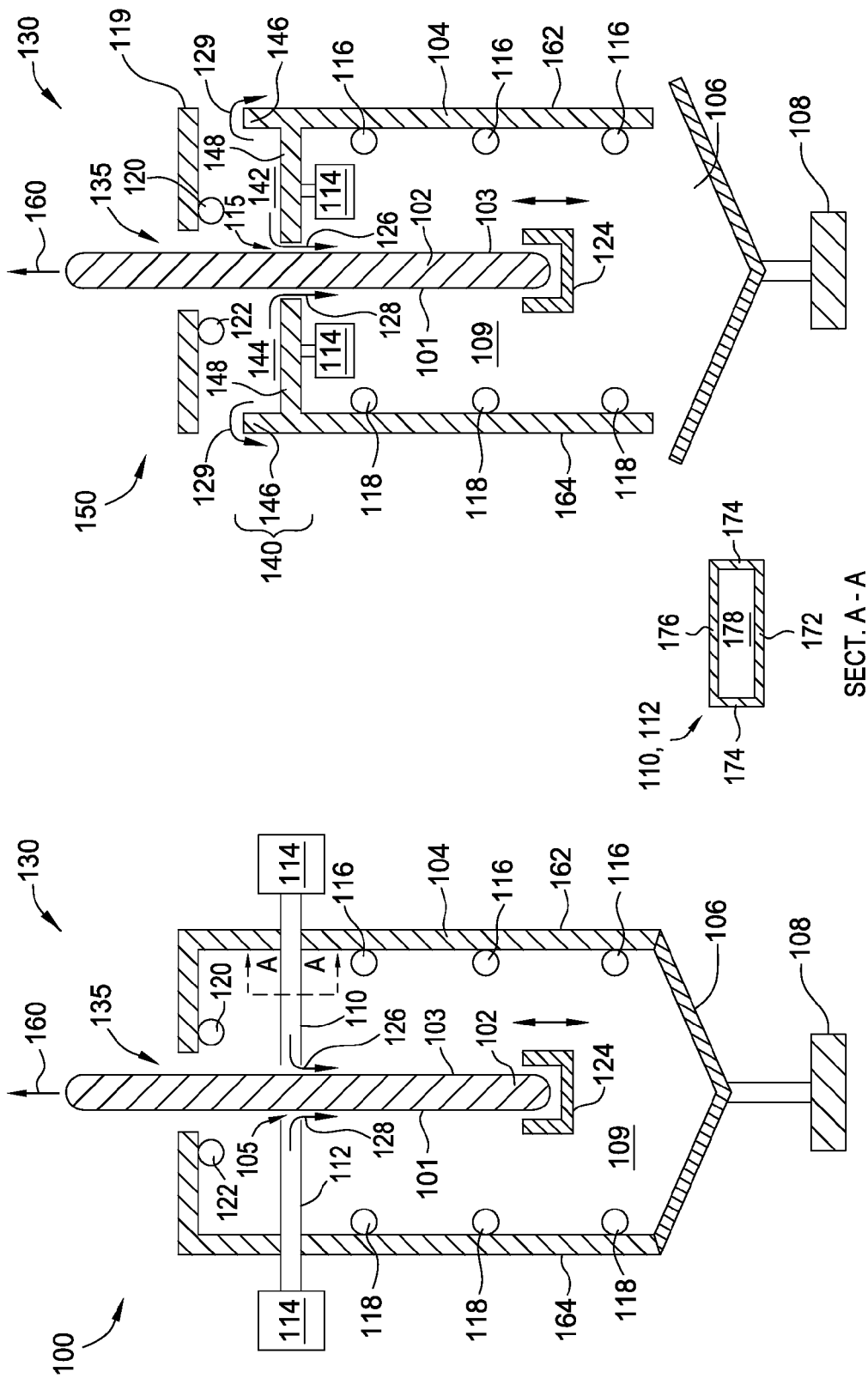

SINGLE USE RINSE IN A LINEAR MARANGONI DRIER

BACKGROUND OF THE INVENTION

Field of the Invention

Embodiments described herein generally relate to drying of wet substrates in a post chemical mechanical polishing cleaning apparatus. More specifically, embodiments described herein relate to a substrate drier for a post chemical mechanical polishing cleaning apparatus.

Description of the Related Art

As semiconductor device geometries continue to decrease, the importance of ultra clean processing increases. Post chemical mechanical polishing (CMP) cleaning is traditionally a wet process performed to clean and completely dry a substrate without leaving any particles or residue on the substrate, which can negatively affect yield. In the process of drying the wet substrate, any particles in the solution present on the substrate prior to drying may reattach to the substrate and remain on the substrate after drying.

A method known as Marangoni drying creates a surface tension gradient to induce bath fluid to flow from a substrate in a manner that leaves the substrate virtually free of the bath fluid, and thus may avoid streaking, spotting, and residue marks on the substrate. During Marangoni drying, a solvent miscible with the bath fluid (i.e., isopropyl alcohol (IPA) vapor) is introduced to a fluid meniscus which forms as the substrate is lifted from the bath or as the bath fluid is drained past the substrate. The solvent vapor is absorbed along the surface of the fluid. The concentration of the absorbed vapor is higher at the tip of the meniscus. The higher concentration of absorbed vapor causes surface tension to be lower at the tip of the meniscus than in the bulk of the bath fluid, causing bath fluid to flow from the drying meniscus toward the bulk bath fluid. Such a flow is known as a "Marangoni" flow and can be employed to achieve substrate drying without leaving streaks, spotting, or bath residue on the substrate.

Aqueous cleaning with a tank of fluid, such as a bath having a solution described above, followed by a rinsing bath (i.e., within a separate tank, or by replacing the cleaning tank fluid) in a Marangoni process generally requires the substrate to be drawn through a bath with a large volume. As such, the entire substrate may be submerged in the tank during certain portions of the cleaning process. Particles introduced into the tank can accumulate in the tank reattach onto the substrate. The problem of particle reattachment may be reduced by creating a fluid flow within the tank. However, apparatuses used to move the substrate through the tank may prevent optimal fluid flow needed to reduce reattachment of particles to the substrate.

Thus, what is needed in the art is an apparatus to prevent reattachment of particles to a substrate in a post CMP drying process.

SUMMARY OF THE INVENTION

Embodiments provided herein generally relate to drying of wet substrates in a post CMP cleaning apparatus.

In one embodiment, an apparatus for rinsing and drying a substrate is provided. The apparatus may comprise a body defining a volume configured to accommodate a semiconductor substrate and one or more rinse fluid members positioned to provide a waterfall of rinse fluid in the volume. A plurality of wetting spray member may be positioned to provide rinsing fluid below the one or more rinse fluid members and a plurality of solvent spray members may be positioned to provide a drying agent above the one or more rinse fluid members.

In another embodiment, an apparatus for rinsing and drying a substrate is provided. The apparatus may comprise a body defining a volume configured to accommodate a semiconductor substrate. A reservoir member may be coupled to the body and have a substrate passage disposed therethrough. The substrate passage may allow fluid in the reservoir member to flow through the substrate passage into a lower portion of the volume. A plurality of wetting spray member may be positioned to provide rinsing fluid below the one or more rinse fluid members and a plurality of solvent spray members may be positioned to provide a drying agent above the one or more rinse fluid members.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic, cross-sectional view of a rinsing and drying apparatus according to certain embodiments described herein;

FIG. 2 is a sectional view of rinse fluid member taken along section lines A-A of FIG. 1; and FIG. 3 is a schematic, cross-sectional view of a rinsing and drying apparatus according to certain embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments provided herein relate to drying of wet substrates in a post CMP cleaning apparatus. The apparatus provides a waterfall or shallow reservoir of rinsing solution, such as deionized water (DIW), through which a substrate may be lifted. A solvent vapor may be provided at the rinsing solution interface on the substrate, such as in a Marangoni process. In certain embodiments, the volume of solution through which the substrate is lifted is reduced, which may provide for reduced or eliminated particle reattachment to the substrate.

FIG. 1 is a schematic, cross-sectional view of a rinsing and drying apparatus 100 according to certain embodiments described herein. The apparatus 100 may be used to clean substrates in a post CMP cleaning and drying process. In such a process, particles resulting from the CMP process may be removed from the substrate 102. Removing particles from the substrate 102 generally increases the overall device yield and improves device performance.

The apparatus 100 comprises a body 104, one or more rinse fluid members 110, 112, a plurality of wetting spray members 116, 118, and a plurality of solvent spray members 120, 122. The body 104 may form a chamber having a volume 109 through which the substrate 102 may be lifted.

The body 104 may be made of materials suitable for a rinsing and drying process, such as aluminum, stainless steel, and alloys thereof, or various polymeric materials. The body 104 has a plurality of sidewalls 162, 164 which define a volume 109 sized accommodate the substrate 102, such as a 200 mm substrate, 300 mm substrate, 450 mm substrate, or other substrate. The sidewalls 162, 164 may be substantially parallel to a path 160 along which the substrate 102 travels in the volume 109. For example, a first sidewall 164 may be substantially parallel to and face a device side 101 of the substrate 102 and a second sidewall 162 may be substantially parallel to and face a backside 103 of the substrate 102. A bottom portion of the body 104 may comprise a fluid collection member 106, such as a tank or pan, which may be adapted to collect fluid used during the rinsing process. The fluid collection member 106 may be coupled to a drain 108 to remove used rinse fluid from the apparatus 100.

The plurality of wetting spray members 116, 118 may be coupled to the sidewalls 162, 164 between the fluid collection member 106 and the one or more rinse fluid members 110, 112. In one embodiment, a first plurality of wetting spray members 118 may be coupled to the first sidewall 164 and a second plurality of wetting spray members 116 may be coupled to the second sidewall 162 facing the spray members 118. In one embodiment, the first plurality of wetting spray members 118 may be adapted to provide a rinse fluid to the device side 101 of the substrate 102 from a rinse fluid source 114. The second plurality of wetting spray members 116 may be adapted to provide a rinse fluid to the backside 103 of the substrate from the rinse fluid source 114. The rinse fluid may be a fluid adapted to rinse the substrate 102, such as DIW or another suitable fluid adapted to remove particles from the substrate 102. In certain embodiments, the rinse fluid may comprise a dilute chemistry adapted to change the zeta potential (electrokinetic potential) of the substrate 102 surface, particles attached to the substrate 102, or surfactant present on the surface of the substrate 102 to prevent premature drying of the substrate 102. For example, dilute tetramethylammonium hydroxide or dilute ammonium hydroxide, dissolved carbon dioxide (carbonic acid), and various ionic and non-ionic surfactants may be used as rinse fluid provided by the wetting spray members 116, 118. It is contemplated that utilizing a rinse fluid adapted to change the zeta potential of the substrate 102 may be especially effective in preventing premature drying of hydrophobic substrates processed by the apparatus 100.

The wetting spray members 116, 118 may be disposed along the sidewalls 162, 164 in various orientations, such as various vertical or horizontal orientations, or combinations thereof. The first and second plurality of wetting spray members 118, 116 may comprise spray mechanisms, such as a single linear nozzle extending vertically along the sidewalls 162, 164 or a plurality of nozzles. The wetting spray members 116, 118 may be adapted to provide a continuous spray to provide complete coverage of the substrate 102 when the plurality of wetting spray members 116, 118 are spraying rinse fluid on the substrate 102. For example, the wetting spray members 116, 118 may be adapted to provide coverage to an entire circular plan area of the substrate 102. Although shown as each having three spray members in FIG. 1, it is contemplated that the first and second plurality of wetting spray members 116, 118 may have any convenient number of spray members.

The wetting spray members 116, 118 may be adapted to spray rinse fluid to both the device side 101 and backside side 103 of the substrate 102. Wetting the substrate 102 prior to passage through the opening 105 between the one or more rinse fluid members 110, 112 allows the rinse fluid provided by the plurality of wetting spray members 116, 118 to prepare the surfaces of the substrate 102 for additional rinsing. It is believed that the substrate 102 having wet surfaces may be more receptive to the rinse fluid provided by the one or more rinse fluid members 110, 112. As described above, a dilute chemistry adapted to change the zeta potential of the substrate 102 surface may be provided to a hydrophobic substrate to prevent premature drying of the substrate 102 prior to being rinsed with DIW provided by the rinse fluid members 110, 112.

The one or more rinse fluid members 110, 112 may be coupled to the body 104 at a region above the plurality of wetting spray members 116, 118. A first rinse fluid member 112 may be coupled to the first sidewall 164 facing the device side 101 of the substrate 102. A second rinse fluid member 110 may be coupled to the second sidewall 162 facing the backside 103 of the substrate 102. The first rinse fluid member 112 and the second rinse fluid member 110 may be disposed opposite one another and face each other.

The rinse fluid members 110, 112 may comprise fluid transport member, such as a tray or trough. The rinse fluid members 110, 112 may have a width greater than the diameter of the substrate 102. In the embodiment shown in FIG. 1, a single rinse fluid member may be located on either side of the substrate 102. It is contemplated that multiple rinse fluid members may be located on a single side of the substrate 102 which may be adapted to provide a single rinse fluid flow or multiple rinse fluid flows to the substrate 102. As shown in FIG. 2, the rinse fluid members 110, 112 may comprise a bottom portion 174, sidewalls 174, and a top portion 176 forming an enclosed conduit 178. In one embodiment, the top portion 176 may be optional, making the conduit 178 open to above.

In operation, the rinse fluid flows from the rinse fluid source 114 through the conduit 178 of the rinse fluid members 110, 112. The rinse fluid members 110, 112 have an open end disposed adjacent the substrate 102 to direct rinse fluid exiting the rinse fluid members 110, 112 along fluid travel paths 126, 128 against the device side 101 and backside 103 of the substrate 102. The open ends of the rinse fluid members 110, 112 are sufficiently spaced a distance from the substrate 102 such that the fluid travel paths 126, 128 may each form a waterfall prior to contacting the substrate 102 which moves rinse fluid across the device side 101 and backside 103 of the substrate 102 in a generally downward flow. The rinse fluid source 114 may continuously provide rinse fluid via the rinse fluid members 110, 112. In one embodiment, the rinse fluid is used once to rinse the substrate 102. It is believed that the continuous waterfall-like flow of the rinse fluid reduces the potential for particle reattachment on the substrate 102. Further, the waterfall-like flow may be precisely controlled at the interface where the rinse fluid contacts the substrate 102 to create a meniscus for performing a Marangoni drying process.

The rinse fluid members 110, 112 may be coupled to the body 104 such that the first rinse fluid member 112 and the second fluid rinse member 110 are disposed substantially within a single horizontal plane. Thus, rinse fluid provided from the rinse fluid members 110, 112 may contact the substrate at substantially the same elevation on both the device side 101 and the backside 103 of the substrate 102. The rinse fluid members 110, 112 may also be coupled to the body 104 such that each fluid rinse member occupies its own horizontal plane. The rinse fluid members 110, 112 may be coupled to the body 104 opposing one another and spaced apart to allow for passage of the substrate 102 through an opening 105 between the rinse fluid members 110, 112. For example, the opening 105 may have a width between about 10 mm and about 50 mm. The fluid source 114 may further comprise a pump (not shown) adapted to control the amount or pressure of rinse fluid provided through the rinse fluid members 110, 112. It is contemplated that the rinse fluid may be provided at a flow rate adequate to contact the substrate 102 when the substrate 102 is moving through the opening 105.

The solvent spray members 120, 122 may be coupled to the body 104 at a region above the rinse fluid members 110, 112. An additional solvent spray member 122 may be coupled to the first sidewall 164 of the body 104 facing the device side 101 of the substrate 102. Another solvent spray member 120 may be coupled to the second sidewall 162 of the body 104 facing the backside 103 of the substrate 102. The solvent spray members 120, 122 may face each other. The solvent spray members 110, 112 may also be coupled to a ceiling 119 of the body 104. The solvent spray members 120, 122 may be positioned above the region in the opening 105 where the rinse fluid contacts the substrate 102. The solvent spray members 120, 122 may be adapted to provide a continuous spray of vapor across both the device side 101 and the backside 103 of the substrate 102 as the substrate 102 is elevated across the opening 105 where the rinse fluid is directed in contact the substrate 102.

The solvent spray members 120, 122 may be positioned to spray vapor to a meniscus that forms as the substrate 102 is elevated from the rinse fluid interface in the opening 105. The solvent spray members 120, 122 may comprise a single linear nozzle circumscribing the passage through which the substrate 102 travels or a plurality of nozzles. In one embodiment, the solvent spray members 120, 122 comprise a stainless steel or quartz tube having a line of holes formed therein. For example, the tube may have 114 uniformly spaced holes, each hole having a diameter between about 0.005 inches to 0.007 inches diameters uniformly spaced along the tube adjacent the substrate 102.

Each of the solvent spray members 120, 122 may be oriented so as to direct a drying agent, such as an IPA vapor, Novec™ fluid available from 3M, or other suitable fluids, at a desired angle relative to the path 160 of the substrate 102. The vapor flow may be directed with or without the aid of a flow detector (not shown) and the angle of the flow may vary depending upon the material exposed on the substrate 102 to be dried. The presence of a surface tension gradient on the substrate 102 may cause the rinse fluid to flow away from regions of low surface tension. The surface tension gradient may be created at the liquid/vapor interface. The vapor supplied to the fluid meniscus on the substrate 102 creates a Marangoni force that results in a downward rinse fluid flow. Thus, a portion of the substrate 102 above the meniscus may be dried. As the substrate 102 is lifted along the path 160, the substrate 102 is lifted toward the vapor spray provided by the solvent spray members 120, 122 thereby drying the entire substrate 102.

Various exhaust manifolds (not shown) may also be coupled to the volume 109 to exhaust vapors and other gases from the volume 109. In certain embodiments, nitrogen or other inert gases may be flowed with the IPA in order to create a nitrogen blanket. The nitrogen may be flowed through the solvent spray members 120, 122 directed at the meniscus to provide nitrogen to the substrate 102 surface. The nitrogen flow may control the IPA vapor flow rate. In one embodiment, the nitrogen flow may be provide from an apparatus (not shown) located near or within an unload port 135 to prevent IPA vapor from exiting the volume 109. A transfer robot (not shown) adapted to receive one or more dried substrates and transfer the substrates to substrate handling mechanisms for lading the clean and dry substrates into a cassette disposed in a factory interface.

The body 104 may further include a loading port (not shown), which may be a location through which the substrate 102 may pass to enter the volume 109. The loading port may be disposed through the body 104 at any convenient location, such as through a sidewall of the body 104 or through a top wall or lid of the body 104. The unloading port 135 may optionally be used as the load port. A guide 124, such as a wet pusher, may be disposed in the volume 109 and/or coupled to the body 104 and may be adapted to lift the substrate 102 vertically through the volume 109 such that the substrate 102 is completely exposed to the vapor exiting the solvent spray members 120, 122. The guide 124 may include a slot, such as a V or U shaped slot in which an edge of the substrate 102 may be disposed during a rinsing process. Alternatively, the guide 124 may include a beveled surface against which the substrate 102 edge may rest in order to minimize contact of the guide 124 with the substrate 102. In one embodiment, the guide 124 may be adapted to lift the substrate 102 through the volume 109 along a substantially vertical path 160. In certain embodiments, the path 160 may be angled and deviate from the vertical orientation shown in FIG. 1. The guide 124 may also retain the substrate 102 in a vertical or other desired orientation.

The substrate 102 may be moved vertically upward through the volume 109 by the guide 124 toward the unload port 135 with a lifting velocity profile. For example, while the substrate 102 is adjacent the plurality of wetting spray members 116, 118, the lifting velocity may proceed at a first speed of about 10 mm/sec. When a leading edge of the substrate 102 reaches the opening 105 where a meniscus may form, the speed may slow to about 5 mm/sec or less. After the entire substrate 102 has passed through the opening 105 and been dried, the guide 124 may increase the velocity to a speed of about 10 mm/sec to transfer the substrate 102 through the unload port 135 into the output chamber 130.

FIG. 3 is a schematic, cross-sectional view of another rinsing and drying apparatus 150 according to certain embodiments described herein. Identical features of the apparatus 150 described with regard to the apparatus 100 depicted in FIG. 1 will not be further discussed for the sake of brevity. The plurality of wetting spray members 116, 118 may be coupled to the body 104 below a reservoir member 140 and the plurality of solvent spray members 120, 122 may be coupled to the body 104 above the reservoir member 140.

The reservoir member 140 comprises a bed 148, a weir 146, and volumes 142, 144. The reservoir member 140 may also have a substrate passage 115 disposed in the bed 148 to allow for passage of the substrate 102 therethrough. A rinse fluid source 114 may be coupled to the reservoir member 140 to provide rinse fluid to the volumes 142, 144. The weir 146 may extend from the bed 148 a distance to define the volumes 142, 144 of the reservoir member 140. A depth of the reservoir member 140 may be between about 0.10 inches and about 5.0 inches, such as between about 0.25 inches and about 2.0 inches. A rinse fluid, such as DIW, provided by the rinse fluid source 114 to the volumes 142, 144 generally fills the volumes 142, 144 and may be provided in an amount such that the rinse fluid flows over both the weir 146 along fluid travel path 129 and along path 126, 128 into contact with the substrate 102. Although shown as coupled to the bed 148, the rinse fluid source 114 may be coupled to the reservoir member 140 at any convenient location to provide rinse fluid to the volumes 142, 144. The rinse fluid provided from the rinse fluid source 114 may be provided such that a majority of the rinse fluid flows along fluid travel path 129. The fluid flow within the reservoir member 140 provides high turnover of rinse fluid within the volumes 142, 144 to prevent the collection of particles within the volumes 142, 144 that may reattach to the substrate 102.

The volume 142 facing the substrate 102 backside 103 may be adapted to rinse the backside 103 of the substrate 102 while the volume 144 facing the device side 101 of the substrate 102 may be adapted to rinse the device side 101 of the substrate 102. The volumes 142, 144 may comprise a single, continuous volume or may comprise multiple, discrete volumes. The bed 148 extending laterally inward into the volume 109 from the body 104 and the weir 146 may provide a structure for the volumes 142, 144. The bed 148 may extend a first distance from the first sidewall 164 and a second distance from the second sidewall 162. The first and second distance may be substantially equal and the substrate passage 115 may be disposed through the bed 148. The substrate passage 115 may be sized to allow for passage of the substrate 102 and to allow a small amount of rinse fluid to flow across the substrate 102 surfaces along fluid travel paths 126, 128. However, the amount of rinse fluid flowing through the substrate passage 115 may be minimized by the size of the substrate passage 115 and the presence of the substrate 102 moving through the substrate passage 115. The substrate passage 115 may have a width between about 2 mm and about 10 mm. The rinse fluid flowing along fluid travel paths 126, 128 may be collected by the fluid collection member 106. The fluid collection member 106 may also be adapted to collect rinse fluid traveling along fluid travel path 129. As such, a portion of the fluid collection member 106 may extend outward beyond the body 104 to collect rinse fluid that flows over the weir 146.

Rinse fluid may be maintained in the volumes 142, 144 such that rinse fluid continually flows over the weir 146 along fluid travel path 129 and fluid paths 126, 128. Rinse fluid flowing along fluid paths 126, 128 may flow through the substrate passage 115 across the width of the entire substrate 102. After contacting the substrate 102, rinse fluid along fluid paths 126, 128 may flow through the volume 109 to the fluid collection member 106 so that the volume 109 remains substantially free of collected rinse fluid. The plurality of solvent spray members 120, 122 may be coupled to the body 104 at a region adapted to perform a Marangoni process. For example, the plurality of solvent spray members 120, 122 may be adapted to provide a solvent at the meniscus formed on the substrate 102 as the substrate is raised from the volumes 142, 144 of the reservoir member 140 containing the rinse fluid. It is contemplated that the topography of the volumes 142, 144 formed by the bed 148 and weir 146 may be adapted to reduce flow dead zones, such as areas within the volumes 142, 144 which exhibit little or no fluid flow. For example, no apparatuses, such as guides or nozzles, may be present in the volumes 142, 144 which may encourage the collection of particles within the volumes 142, 144. As such, reattachment of particles to the substrate 102 may be reduced or eliminated prior to the substrate 102 being dried.

While the foregoing is directed to embodiments of the present invention, other and further embodiments of the invention may be devised without departing from the basic scope thereof, and the scope thereof is determined by the claims that follow.

The invention claimed is:

1. An apparatus for rinsing and drying a substrate, comprising:
    a body defining a volume configured to accommodate a semiconductor substrate;
    one or more reservoir members comprising a weir, the one or more reservoir members coupled to one or more rinse fluid sources and to the body having a substrate passage disposed therethrough, wherein the substrate passage is sized to allow passage of a substrate, the substrate passage allowing the reservoir members to provide a waterfall of rinse fluid from the one or more rinse fluid sources through the substrate passage into a lower portion of the volume;
    a plurality of nozzles positioned to provide rinse fluid for coverage across an area of the substrate below the one or more reservoir members;
    a plurality of solvent spray members positioned to provide a drying agent above the one or more reservoir members, and
    a fluid collection member spaced from the body and below the body and extending outward beyond the body such that the volume is open to a region external to the body and rinse fluid does not collect in the volume, wherein the fluid collection member is adapted to collect rinse fluid that flows over the weir and rinse fluid that flows through the substrate passage.

2. The apparatus of claim 1, further comprising a guide member disposed in the volume and adapted to control an elevation of the substrate within the volume.

3. The apparatus of claim 2, wherein the guide member is coupled to the body in a manner such that the substrate remains above rinse fluid collected within the fluid collection member.

4. The apparatus of claim 1, wherein the one or more reservoir members further comprise:
    a first reservoir member and a second reservoir member coupled to the body, wherein the first reservoir member and the second reservoir member face one another.

5. The apparatus of claim 4, further comprising a guide member adapted to pass the substrate between the first and second reservoir members.

6. The apparatus of claim 1, wherein the rinse fluid sources are configured to provide de-ionized water to the volume.

7. The apparatus of claim 6, wherein the guide member is adapted to pass the substrate between at least two of the plurality of nozzles.

8. The apparatus of claim 6, wherein the guide member is adapted to pass the substrate between at least two of the solvent spray members.

9. The apparatus of claim 1, further comprising an unload port formed in the body above the plurality of solvent spray members.

10. The apparatus of claim 1, wherein the nozzles are configured to provide a fluid adapted to change a zeta potential of the substrate surface.

11. The apparatus of claim 1, wherein the substrate passage is configured such that the waterfall of rinse fluid from the one or more rinse fluid sources is precisely controlled at an interface where rinse fluid contacts the substrate to create a meniscus suitable for performing a Marangoni drying process.

* * * * *